United States Patent
Turner et al.

(10) Patent No.: US 6,856,531 B2
(45) Date of Patent: *Feb. 15, 2005

(54) HACKER-PROOF ONE TIME PROGRAMMABLE MEMORY

(75) Inventors: Tony M. Turner, Foothill, CA (US); Myron Buer, Gilbert, AZ (US)

(73) Assignee: Broadcom Corporation, Irvine, CA (US)

( * ) Notice: Subject to any disclaimer, the term of this patent is extended or adjusted under 35 U.S.C. 154(b) by 33 days.

This patent is subject to a terminal disclaimer.

(21) Appl. No.: 10/750,835

(22) Filed: Jan. 5, 2004

(65) Prior Publication Data

US 2004/0228157 A1 Nov. 18, 2004

Related U.S. Application Data

(63) Continuation of application No. 10/438,347, filed on May 15, 2003, now Pat. No. 6,707,696.

(51) Int. Cl.[7] .............................................. G11C 17/00
(52) U.S. Cl. ................ 365/96; 365/189.08; 365/230.06
(58) Field of Search .............................. 365/96, 189.08, 365/189.05, 230.06, 226

(56) References Cited

U.S. PATENT DOCUMENTS 6,707,696 B1 * 3/2004 Turner et al. ................. 365/96

* cited by examiner

*Primary Examiner*—Richard Elms
*Assistant Examiner*—Hien Nguyen
(74) *Attorney, Agent, or Firm*—Sterne, Kessler, Goldstein & Fox, PLLC

(57) ABSTRACT

A one time programmable memory circuit includes a one time programmable memory array. A write circuit outputs data to the one time programmable memory array. A power up write controller outputs the data and a write enable signal to the write circuit. A read circuit outputs data from the one time programmable memory array upon a read enable signal received from a read controller. An address decoder communicates with the power up write controller and the read controller, for providing an address to the one time programmable memory array.

10 Claims, 9 Drawing Sheets

| 1 | 0 | 1 1 | 0 | 1 | 0 | 1 |
|---|---|---|---|---|---|---|
| 1 1 | 1 | | 0 | 0 | 0 | 1 |
| 0 | 1 | 0 | 1 | 0 | 0 | 1 |

⋮ 101

| 0 | 0 | 1 | 1 | 0 | 1 | 1 | 0 |
|---|---|---|---|---|---|---|---|
| 0 | 1 | 0 | 1 | 0 | 1 | 0 | |

Conventional Art

FIG. 2

| | | | | | | | |
|---|---|---|---|---|---|---|---|
| 1 | 0 | 1 | 1 | 0 | 1 | 0 | 1 |
| 1 | 1 | 1 | | 0 | 0 | 0 | 1 |
| 0 | 1 | 0 | | 1 | 0 | 0 | 1 |

⋮ 401

| | | | | | | | |
|---|---|---|---|---|---|---|---|
| 0 | 0 | 1 | 1 | 0 | 1 | 1 | 0 |
| 0 | 1 | 0 | 1 | 0 | 1 | 0 | |

FIG. 5

HACKER-PROOF ONE TIME PROGRAMMABLE MEMORY

CROSS REFERENCE TO RELATED APPLICATIONS

This application is a continuation of U.S. Pat. No. 10/438, 347, filed on May 15, 2003 now U.S. Pat. No. 6,707,696, which is incorporated by reference herein.

This application incorporates by reference U.S. Pat. No. 6,525,955, entitled "Memory Cell With Fuse Element", U.S. patent application Ser. No. 10/038,021, filed on Jan. 3, 2002, U.S. patent application Ser. No. 10/041,296, filed on Jan. 8, 2002, and U.S. patent application Ser. No. 10/197,437, filed on Jul. 18, 2002.

BACKGROUND OF THE INVENTION

1. Field of the Invention

100031 The present invention relates to one time programmable memory arrays, and more particularly to one time programmable (OTP) memory arrays that are hacker proof using current hacking techniques.

2. Related Art

FIG. 1 illustrates a conventional OTP memory cell array that is initialized to a known state at power up or reset. For example, in the OTP memory cell array 101 of FIG. 1, the known state is set to all zeros. FIG. 2 illustrates the conventional OTP memory cell array 101 with the bits flipped to the programmed state. The bit flipping causes a detectable edge transition, which can be detected by sophisticated equipment such as E-beam probes, used by hackers today.

FIG. 3 illustrates a conventional set top TV decoder box 301. The decoder box 301 includes a chip 302 that has the OTP memory cell array 101 and a processor 305 that compares encryption keys. The encryption keys are used to prevent hacking of the information stored in the system. The OTP memory cell array 101 holds one-half of the key, and an external SRAM 306 holds the other half of the key. Both keys are compared by the processor 305.

Thus, a particular problem that exists in the set top box industry is the ever increasing sophistication of hackers. Hackers often attempted to obtain unauthorized access key by accessing the key embedded in the set-top box. This typically involved the opening of the chip package, and examination of the chip under a microscope. In the early OTP memory arrays, this would easily yield the key, particularly since the key was identical for thousands of boxes.

Later, as the OTP memories became more sophisticated, so did the techniques used by hackers to discover the key embedded in the memory. Such techniques include, for example, the use of X-rays, E-beam probes, etc. Such techniques can frequently detect the rapid transition of a bit from one state to another during power up.

Conventional OTP memories can be hacked, and their contents can be discovered by several methods. A poly fuse OTP can be X-rayed and the fuses can visually be seen. A gate oxide fuse type OTP memory can be connected to an E-beam probe station and the bits can be observed at power up to determine their state—assuming the OTP memory has an initial state.

Accordingly, what is needed is a method and system that prevents a hacker from using the power up sequence to discover the secure key embedded in the OTP memory.

BRIEF SUMMARY OF THE INVENTION

Accordingly, the present invention is directed to a hacker-proof OTP memory that substantially obviates one or more of the disadvantages of the related art.

There is provided a one time programmable memory array. A write circuit outputs data to the one time programmable memory array. A power up write controller outputs the data and a write enable signal to the write circuit. A read circuit outputs data from the one time programmable memory array upon a read enable signal received from a read controller. An address decoder communicates with the power up write controller and the read controller, for providing an address to the one time programmable memory array.

Additional features and advantages of the invention will be set forth in the description which follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGURES

The accompanying drawings, which are included to provide a further understanding of the invention and are incorporated in and constitute a part of this specification, illustrate embodiments of the invention and together with the description serve to explain the principles of the invention. In the drawings:

FIG. 2 illustrates a programmed conventional one time programmable memory.

FIG. 5 illustrates an OTP memory of the present invention after programming and after power up.

DETAILED DESCRIPTION OF THE INVENTION

Reference will now be made in detail to the preferred embodiments of the present invention, examples of which are illustrated in the accompanying drawings.

In the present invention, the OTP memory data area is not initialized to any known state at power up, reset or any initialization phase. This prevents a hacker from using an E-beam prober to detect the bit values.

If the bits are initialized to a 0 or a 1 state at any time, the memory bit in the OTP memory will flip states for a short period of time before it returns to its programmed state. To eliminate hacking, no bit in a DATA region of the OTP memory is ever set to a known value. When the device powers up, the bits will cause no detectable change on equipment used by hackers because the bits will move with the power rail of the device and appear as any other power net.

Figure 1:
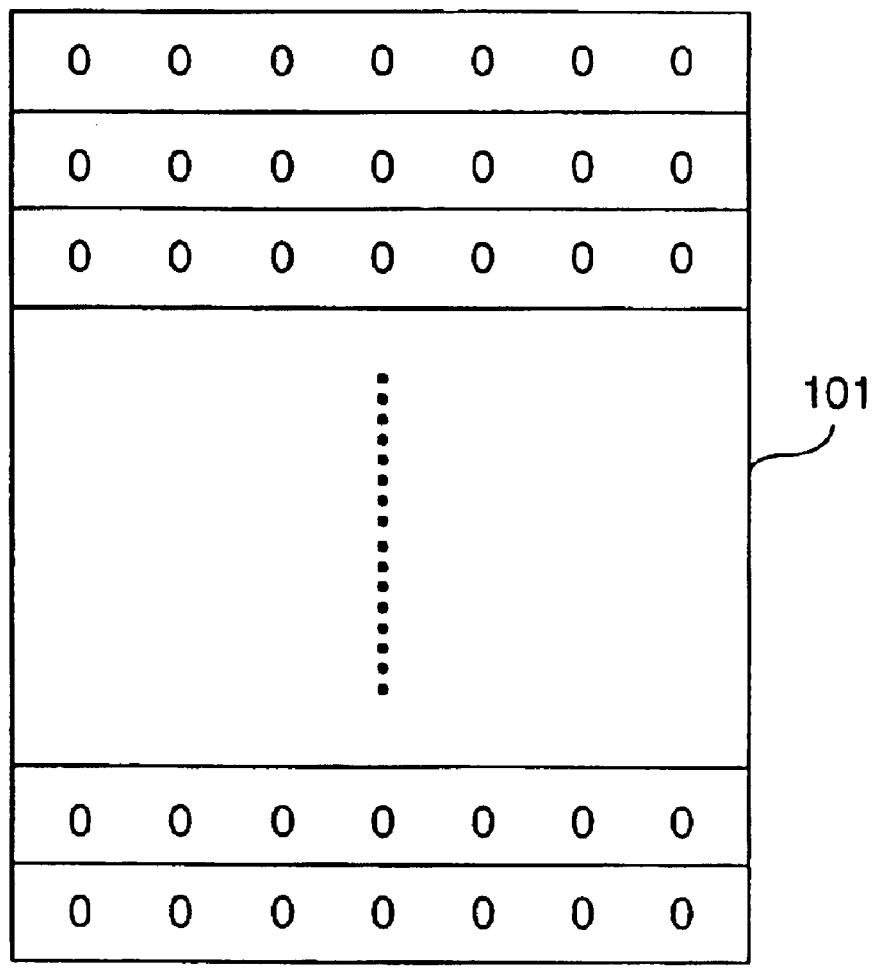
FIG. 1 illustrates a conventional unprogrammed one time programmable memory cell.
Figure 3:
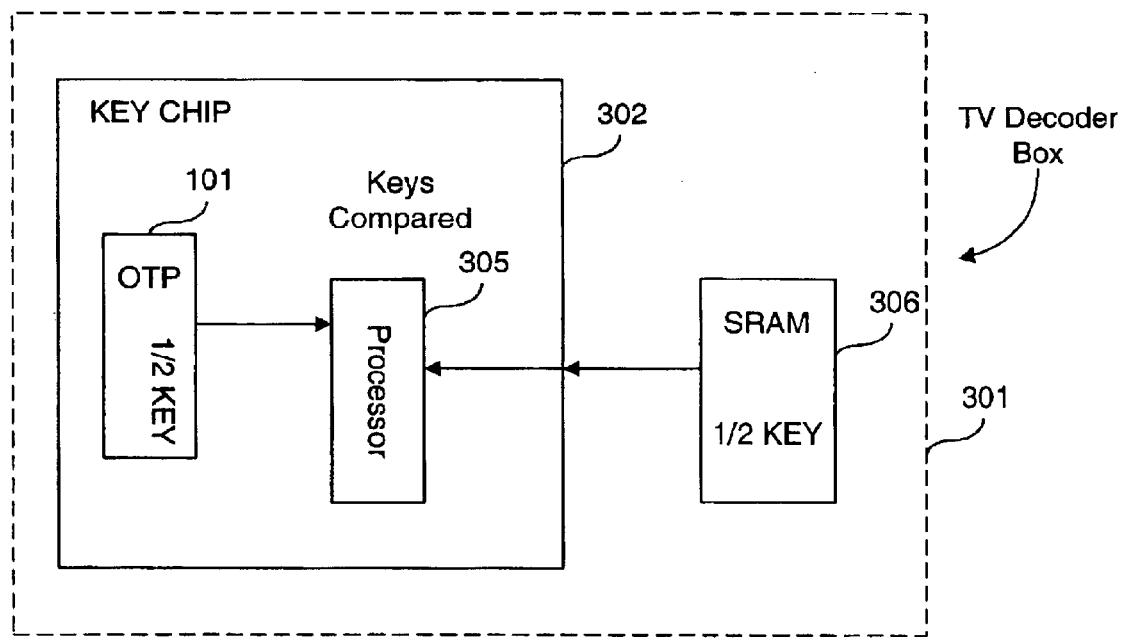
FIG. 3 illustrates a set top box system with OTP and security key.
Figure 4:
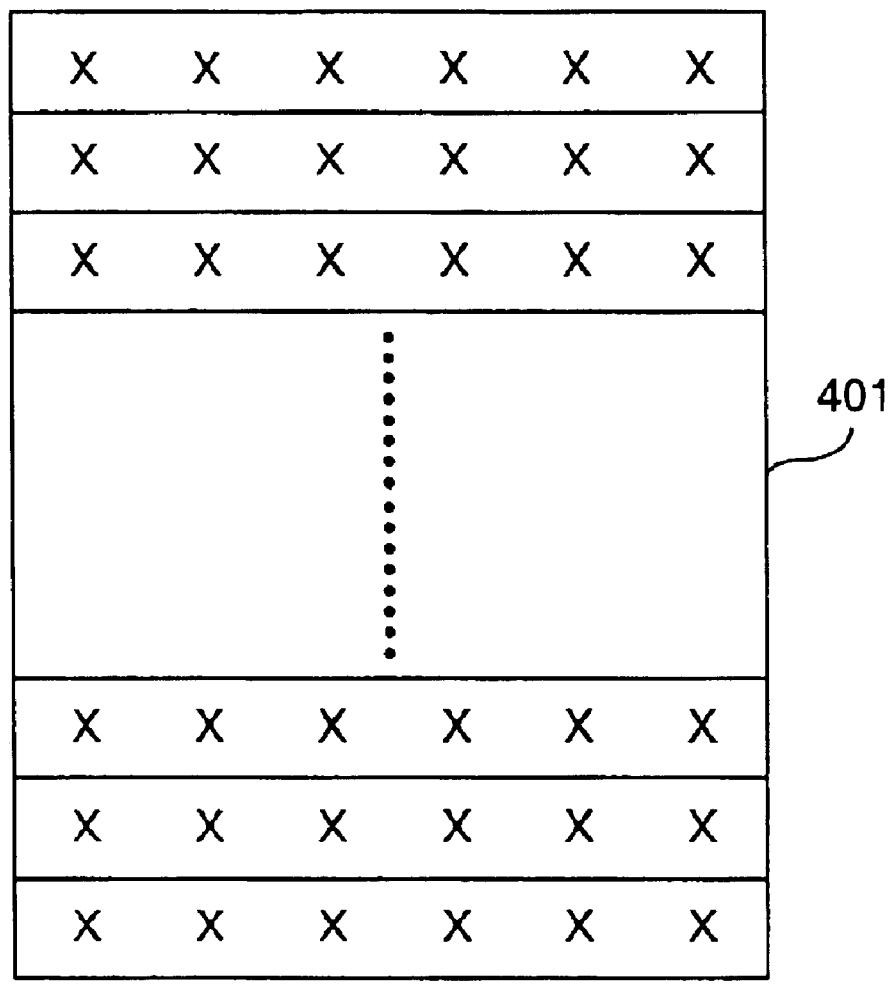
FIG. 4 illustrates an OTP memory cell array of the present invention prior to programming.

FIG. 4 illustrates an OTP memory cell array 401 of the present invention. In the array 401, the memory cells are not initialized to a known state at power up or reset. Rather, as shown in FIG. 5, the array 401 has the bits rise slowly, with the power rails to the actual bit values. Furthermore, the current consumed for the bit to flip to one or zero is the same. Thus, no detectable edge is seen even by a sophisticated probe, because the speed of the power up of the bits is the same as the speed of the power up of the rails.

Figure 6:
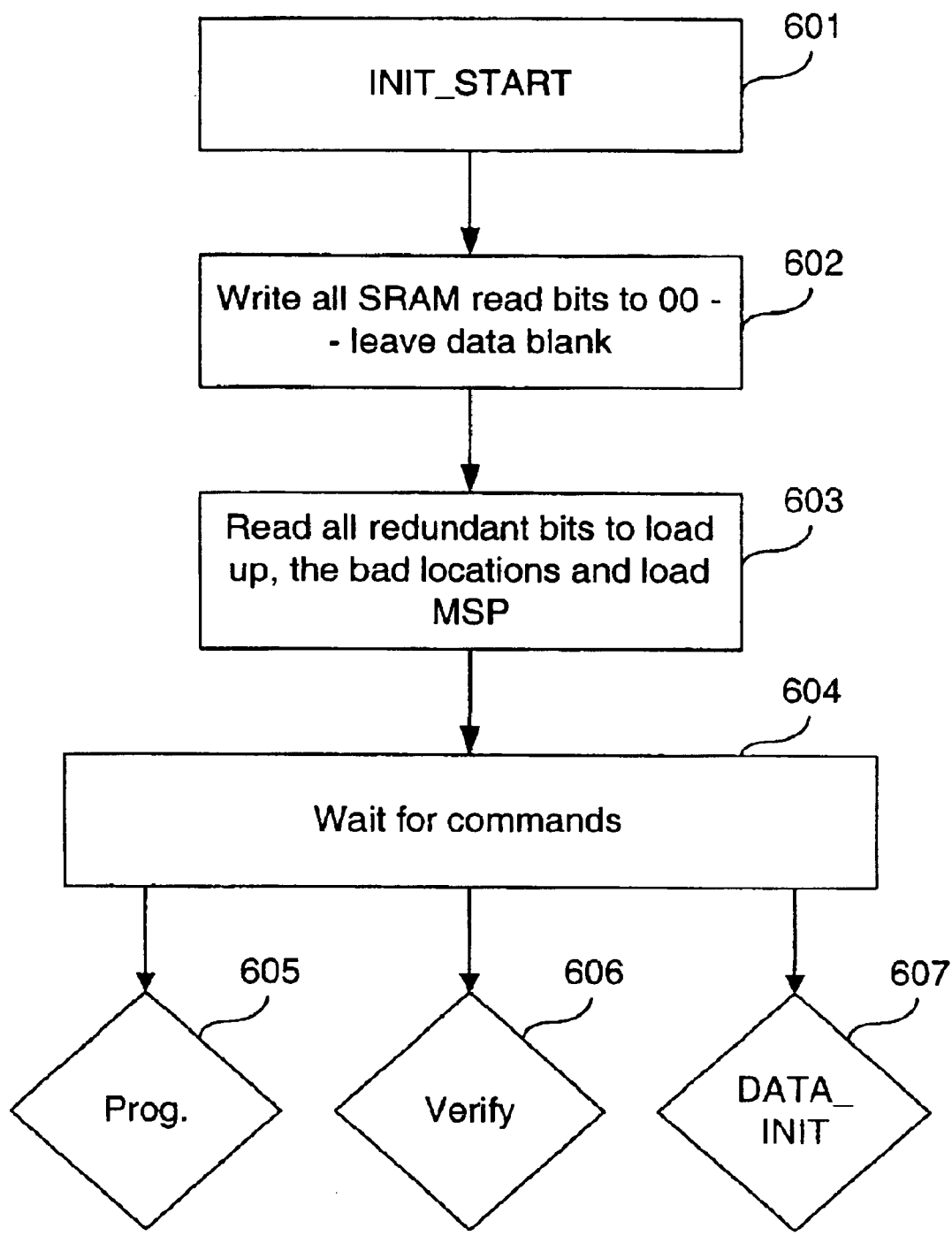
FIG. 6 shows a flowchart for programming the OTP memory of FIGS. 4 and 5.

FIG. 6 illustrates a flowchart for the method used to program the OTP memory cell array 401 of the present invention. As shown in FIG. 6, during the initialization step 601, all the SRAM read bits are written to zero, while the data bits are left blank. During step 602, the redundant bits (i.e., non-secure parity bits) load up, and the bad locations and the Multi-Stage Programming (MSP, i.e., non-secure data) bits are also loaded. After waiting for commands (step 604) the OTP memory cell array 401 is either programmed (step 605), verified (step 606), or in the case where the OTP memory cell array 401 is programmed, its data is initialized to the programmed state (step 607).

Figure 7:
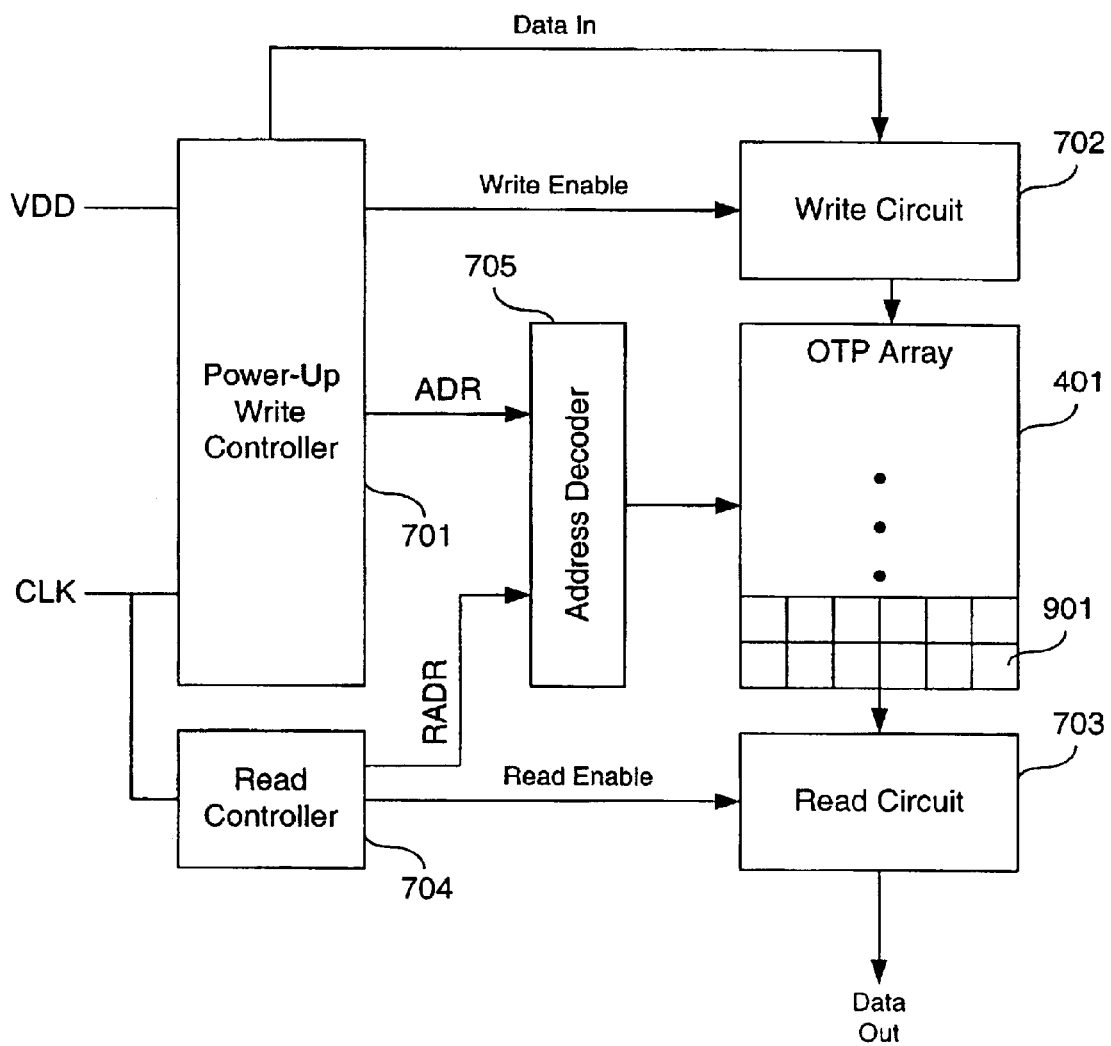
FIG. 7 shows the logic around the OTP memory of the present invention.

FIG. 7 illustrates the circuitry around the OTP memory cell array 401 that is used to implement the gradual power up described above. To effect the gradual power-up, such that the transitions are undetectable, it is necessary to have a a write circuit that outputs data to the one time programmable memory array 401, and a power up write controller outputting the data. The power up write controller does so upon a write enable signal. Also, a read circuit is needed to output data from the one time programmable memory array 401 upon a read enable signal received from a read controller. An address decoder communicates with the power up write controller and the read controller, so as to provide an address to the one time programmable memory array 401 when the data is not secure data. This is illustrated in FIG. 7.

As shown in FIG. 7, the circuitry includes a power up write controller 701, a write circuit 702 connected to the OTP memory cell array 401, and a read controller 704 connected to a read circuit 703. The read circuit 703 is connected to the OTP array 401. An address decoder 705 is connected to the OTP memory cell array 401, the power up write controller 701, and to the read controller 704, as shown in FIG. 7. The address decoder provides the address when the data at that address is not secure data. The power up write controller 701 controls the initialization of the programmed data in the OTP array. The initialization control is performed through control of the address decoder 705 and the write circuit 702.

Figure 8:
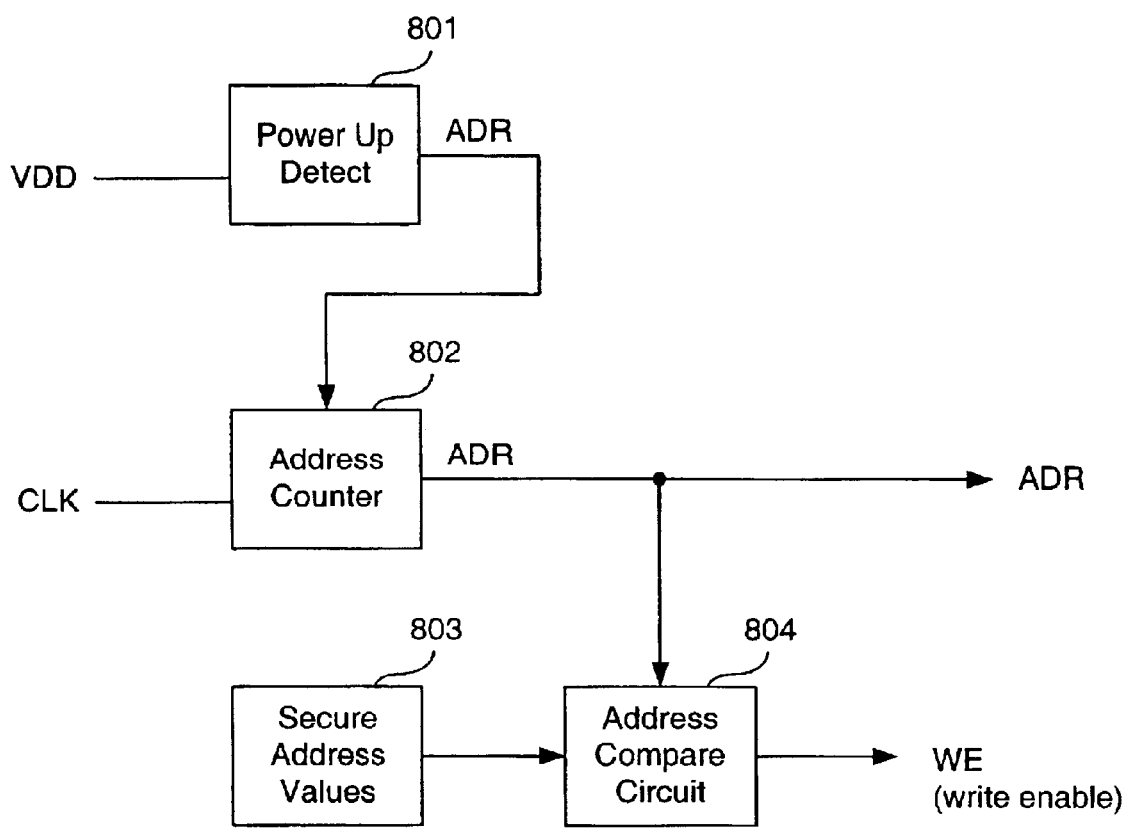
FIG. 8 shows a power up write control circuit of the present invention.

FIG. 8 illustrates additional detail of the power up write controller 701. As shown in FIG. 8, the power up write controller 701 includes a power up detect circuit 801, which is connected to an address counter 802. The ADR bus (see FIG. 7) connects to address 102 with an address compare circuit 804. A secure address block 803 provides the values to the address comparator 804. The address comparator 804 outputs the write enable signal to the write circuit 702. When the power up detect circuit 801 senses that power has been applied to the OTP memory cell array 401, a reset signal is generated to clear the address counter 802. The address counter 802 then cycles through all address locations within the OTP memory cell array 401. Each address is compared to the secure address values in the secure address block 803.

If the address ADR is a secure address, the write enable signal will not be asserted for that address, and the data will not be initialized through the write circuit 702.

Figure 9:
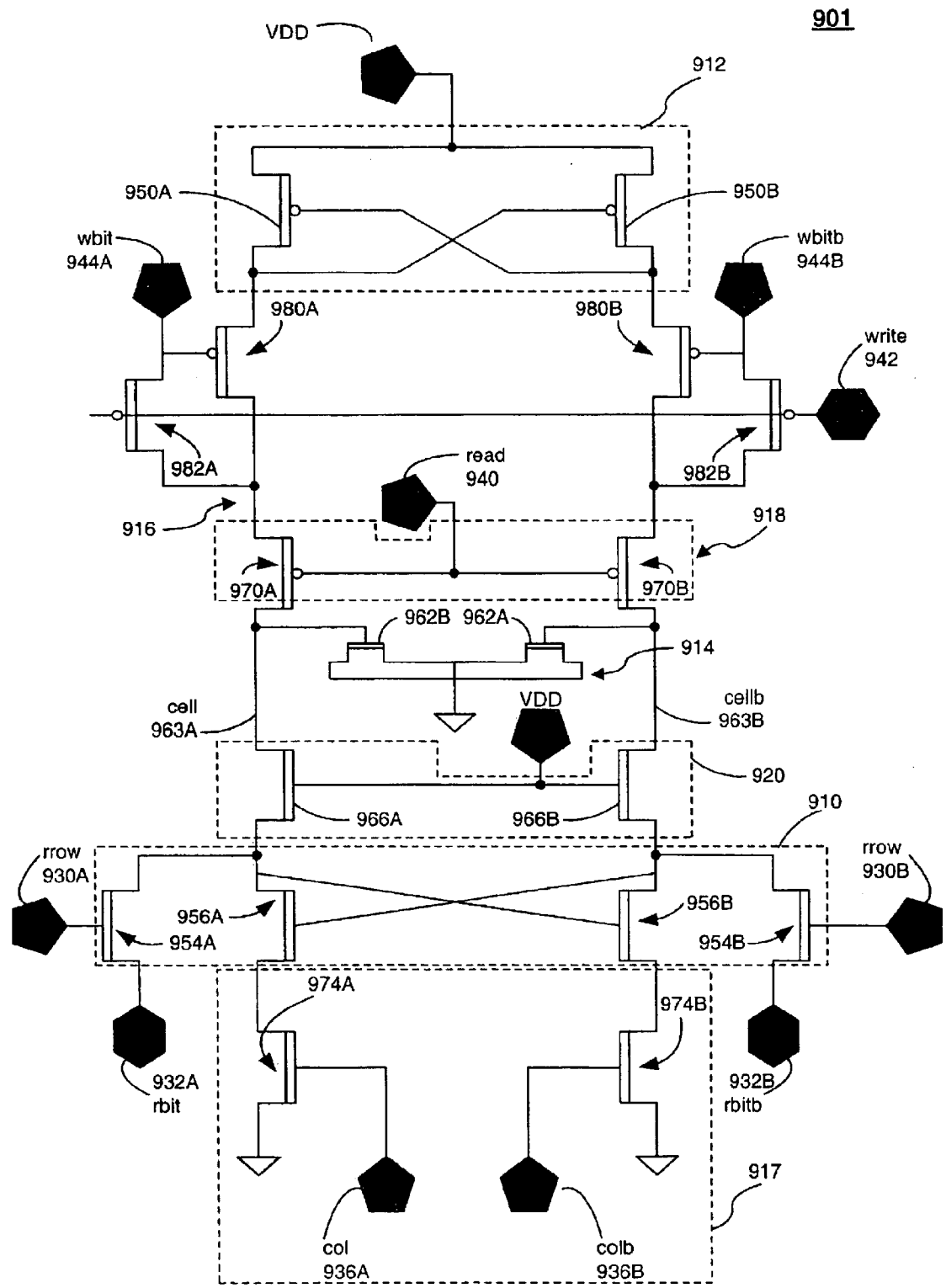
FIG. 9 shows an example of a memory cell used in the OTP memory of the present invention.

A circuit diagram of one embodiment of a memory cell 901 (see OTP memory cell array 401 in FIG. 7) is illustrated in FIG. 9, and is also described in U.S. Pat. No. 6,525,955, which is incorporated by reference herein. In this embodiment, the memory cell 901 comprises a programming device 916 and switch transistors 970A, 970B. The switch transistors 970A, 970B are used to select an appropriate fuse (i.e., fuse 962A or 962B) and, during programming, allow a high voltage (about 6.0 volts or less, but generally about 5.0 volts for example) to be communicated to the selected fuse element.

The programming device 916 is used to keep the non-programmed (i.e., non-selected) fuse transistors 962A or 962B low when setting the state of the memory cell 901. That is, the programming device 916 protects the non-selected fuse transistors 962A or 962B from floating high during programming. This prevents the non-selected fuse transistors 962A or 962B from accidentally blowing.

In this embodiment, a second programming device 917 comprises two NFET transistors 974A and 974B, connected to col 936A and colb 936B via their respective gates. The switch transistors for programming the second programming device 917 comprise four PFET transistors 980A, 980B, 982A and 982B. In one embodiment of the present invention, wbit 944A is coupled to transistors 980A and 982A; wbitb 944B is coupled to transistors 980B and 984B; and write 942 is coupled to the gates of transistors 982A and 982B as shown.

In one embodiment of the present invention comprises storage elements 910 and 912. In the illustrated embodiment, the storage element 912 comprises two cross-coupled PFET transistors 950A and 950B. The storage element 910 comprises four NFET transistors 954A, 954B, 956A and 956B. As illustrated, the transistor 954A is coupled to rbit 932A and rrow 930A; and the transistor 954B is coupled to rrow 930B and to rbitb 932B.

Additionally, the memory cell 901 includes at least one, but generally two or more, level shifters to standoff the high voltage (about 6.5 volts but generally about 5.0 volts for example) used to set the state of the memory cell. A level shifter 920 comprises two NFET transistors 966A, 966B coupled to VDD via their gates. A level shifter 918 comprises the two switch PFET transistors 970A and 970B, discussed above, coupled to read 940 via their gates.

In one embodiment, the level shifters 918, 920 protect the other PFET and NFET transistors of the memory cell 901, when setting the state thereof. For example, PFET transistors 970A and 970B of level shifter 918 protect the other PFET transistors in the memory cell 901 from the high voltage used during programming (i.e., setting the state of the memory cell 901). Likewise, the NFET transistors 966A and 966B of the level shifter 920 protect the other NFET transistors in the memory cell 901 from the high voltage used during programming.

In one embodiment of the present invention, the fuse element 914 comprises two thin gate-oxide NFET transistors 962A and 962B coupled to cell 963A and cellb 963B via their respective gates. In this embodiment, cellb 963B is coupled to transistors 970B and 966B, and cell 963A is coupled to transistors 970A and 966A in addition to being coupled to transistors 962A and 962B.

For secure bits both "1" and "0" states are programmed into the OTP memory by programming gate-ox fulse 962A, for "0" state or by programming gate-ox fuse 962B for "1" state. This allows the secure bits to power up to their programmed state without the requirement of an initialization write.

It is contemplated that, in one embodiment of the present invention, each memory cell consists of one storage element, one level shifter, one programming device, etc. as provided previously although other arrangements are contemplated. Furthermore, it is contemplated that a larger memory may consist of a plurality of memory cells, each memory cell consisting of a storage element, gated fuses, level shifter, etc. as provided previously.

Note that the approach described above only needs to be used with bits that represent the key. Other bits in the OTP memory cell array 401 that do not contain secure information can be preprogrammed in the same manner as in the conventional art.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A one time programmable memory circuit comprising:
   a one time programmable memory;
   a write circuit providing data to the one time programmable memory;
   a power up write controller providing the data and a write enable signal to the write circuit;
   a read circuit outputting data from the one time programmable memory upon a read enable signal from a read controller; and
   an address decoder providing an address to the one time programmable memory for reading to and writing from the one time programmable memory.

2. The circuit of claim 1, wherein the power up write controller includes:
   a power up detection circuit;
   an address counter connected to the power up detection circuit and providing the address;
   a secure address value detector; and
   an address compare circuit providing the write enable signal.

3. The circuit of claim 1, wherein bits of the one time programmable memory that contain a secure key are not programmed until power up.

4. The circuit of claim 1, wherein bits of the one time programmable memory that contain a secure key power up at approximately the same rate as power supply rails.

5. The circuit of claim 1, wherein bits of the one time programmable memory that contain a secure key consume approximately the same amount of current powering up to logical 1 and down to logical 0.

6. A one time programmable memory circuit comprising:
   a one time programmable memory;
   a power up write controller providing data and a write enable signal to the one time programmable memory;
   a read circuit providing data from the one time programmable memory; and
   an address decoder providing an address to the one time programmable memory when the address is not a secure data address.

7. The circuit of claim 1, wherein the power up write controller includes:
   a power up detection circuit;
   an address counter connected to the power up detection circuit and providing the address;
   a secure address value detector; and
   an address compare circuit that provides the write enable signal when the address is not a secure data address.

8. The circuit of claim 7, wherein bits of the one time programmable memory that contain a secure key are not programmed until power up.

9. The circuit of claim 7, wherein bits of the one time programmable memory that contain a secure key power up at approximately the same rate as power supply rails.

10. The circuit of claim 7, wherein bits of the one time programmable memory that contain a secure key consume approximately the same amount of current powering up to logical 1 and down to logical 0.

* * * * *